(12) United States Patent
Täuber et al.

(10) Patent No.: US 6,646,908 B2
(45) Date of Patent: Nov. 11, 2003

(54) INTEGRATED MEMORY CHIP WITH A DYNAMIC MEMORY

(75) Inventors: Andreas Täuber, Unterschleissheim (DE); Robert Feurle, Neubiberg (DE); Paul Schmölz, München (DE); Jean-Marc Dortu, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/113,415

(22) Filed: Apr. 1, 2002

(65) Prior Publication Data

US 2002/0141230 A1 Oct. 3, 2002

(30) Foreign Application Priority Data

Mar. 30, 2001 (DE) .......................................... 101 15 817

(51) Int. Cl.⁷ .............................................. G11C 11/24
(52) U.S. Cl. ...................................... 365/149; 365/233
(58) Field of Search ................................. 365/149, 233

(56) References Cited

U.S. PATENT DOCUMENTS 6,055,206 A * 4/2000 Tanizaki et al. ....... 365/230.06
6,512,711 B1 * 1/2003 Wright et al. ................ 365/203
2002/0163846 A1 * 11/2002 Taruishi et al. ............. 365/222

FOREIGN PATENT DOCUMENTS

DE          41 15 127 A1       1/1992

OTHER PUBLICATIONS

Marc Haberland: "Synchrone Spitzenleistung (Teil 1)" [synchronous high performance (part 1)], Design & Elektronik No. 21, Oct. 15, 1996, pp. 59–61.

* cited by examiner

Primary Examiner—Huan Hoang
(74) Attorney, Agent, or Firm—Laurence A. Greenberg; Werner H. Stemer; Gregory L. Mayback

(57) ABSTRACT

The integrated memory chip has an external control terminal, a dynamic memory, and a control circuit for controlling a memory access to the dynamic memory. The control circuit is connected to the external control terminal, for receiving an access command indicating the beginning of a memory access. The control circuit further has an output, which is connected to the dynamic memory, for outputting at least one activation signal, read command or write command and precharge command generated from the access command. This makes it possible, in the case of use in a data processing system, to dispense with a DRAM controller provided outside the memory chip.

4 Claims, 2 Drawing Sheets

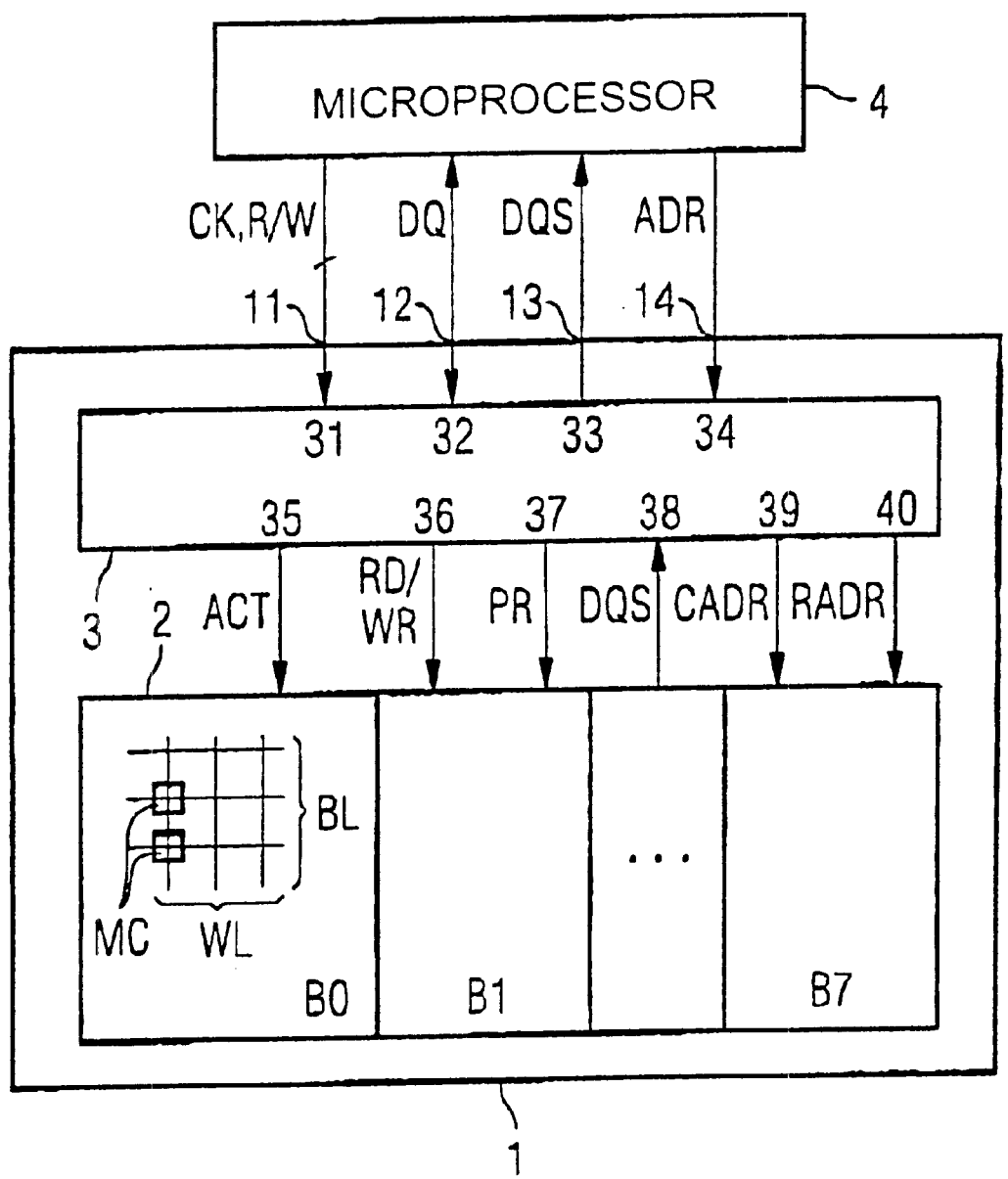

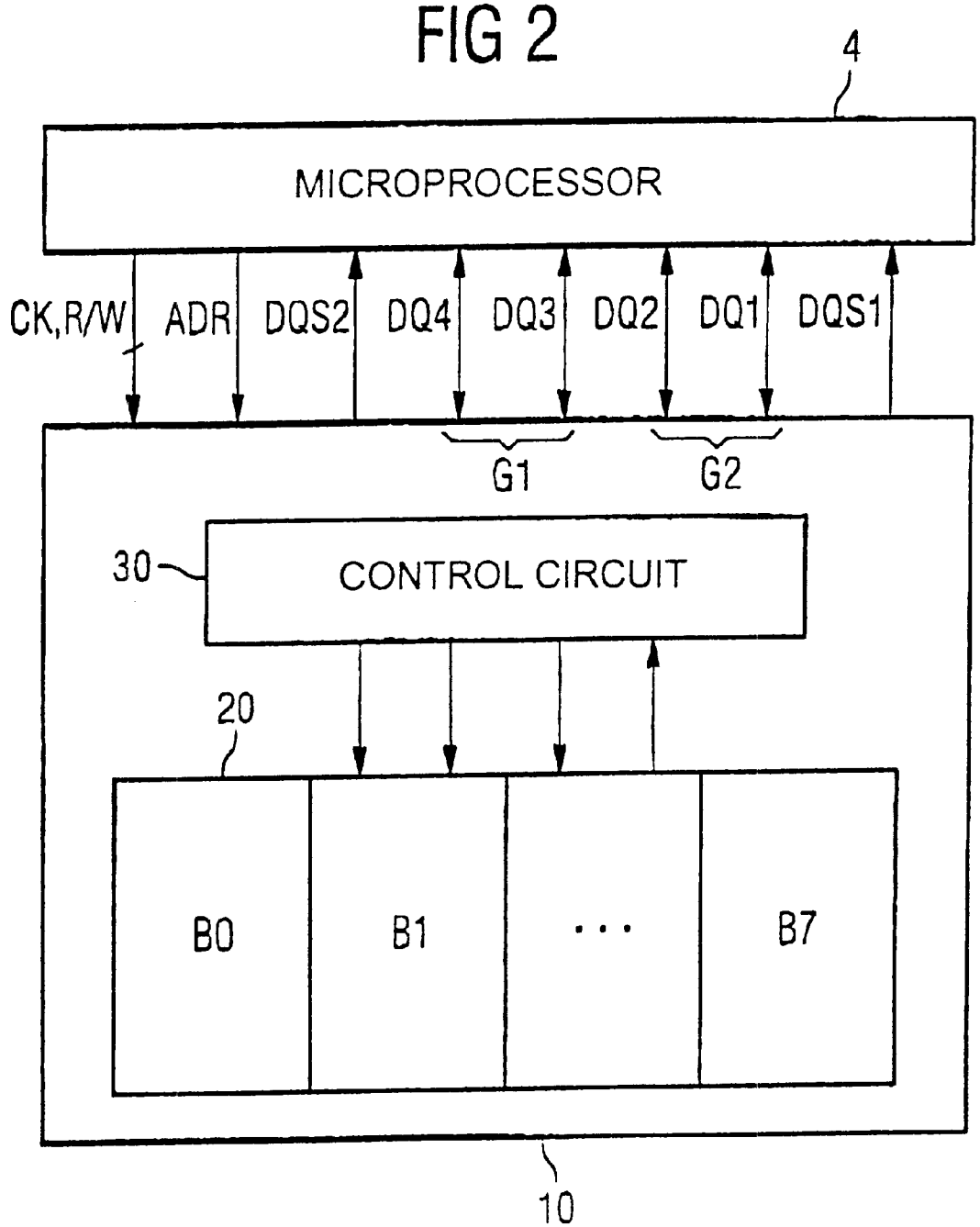

INTEGRATED MEMORY CHIP WITH A DYNAMIC MEMORY

BACKGROUND OF THE INVENTION

Field of the Invention

The present invention relates to an integrated memory chip with a dynamic memory.

Integrated memories for example in the form of so-called DRAM memories (dynamic random access memories) are operated in data processing systems and addressed by a microprocessor, for example. Above a certain size of the memory, for example in the case of a memory size in excess of 1 Mbit, all available DRAM memories generally use a so-called multiplex address scheme. The latter primarily serves for reducing the number of address terminals of a memory chip and thus the costs for the individual components in the data processing system and the power consumption of the corresponding address bus systems.

Such a multiplex address scheme has the advantage that it matches the functionality of a DRAM memory very well. In that case, there are generally activated for a memory access firstly the rows to be driven in the form of selected word lines and subsequently the corresponding columns in the form of selected bit lines. In the case of this address scheme, then, it is necessary to transmit firstly row addresses and subsequently corresponding column addresses. A selection is thus made as to the memory cells from which data are read or the memory cells to which data are written. The microprocessor must likewise send a plurality of individual commands, for example in the form of an activation signal, a read command or write command and, to conclude the memory access, a precharge command.

One disadvantage of such a functionality is, in particular, that a DRAM interface used for this purpose is generally not adapted to the corresponding processor interface. The processor interface is often adapted to fast so-called SRAM memories (synchronous RAM), which are very much smaller than DRAM memories and are generally not operated in the above-mentioned multiplex operating mode.

In order that such a processor interface and a DRAM interface can communicate with one another, it is generally necessary to implement a so-called DRAM controller in the data processing system in order to convert, in the data processing system, the DRAM-specific memory access from the commands of the processor which are oriented to SRAM memories.

SUMMARY OF THE INVENTION

It is accordingly an object of the invention to provide an integrated memory chip with a dynamic memory, which overcomes the above-mentioned disadvantages of the heretofore-known devices and methods of this general type and which makes it possible, in the case of use in a data processor system, to dispense with a DRAM controller.

With the foregoing and other objects in view there is provided, in accordance with the invention, an integrated memory chip, comprising:

an external control terminal;
a dynamic memory;
a control circuit connected between the external control terminal and the dynamic memory for controlling a memory access to the dynamic memory;
the control circuit having an input connected to the external control terminal, for receiving an access command indicating a beginning of a memory access; and
the control circuit having an output connected to the dynamic memory, for outputting at least one signal generated from the access command and selected from the group consisting of an activation signal, a read command or write command, and a precharge command.

In other words, the objects of the invention are achieved with an integrated memory having an external control terminal, comprising a dynamic memory and a control circuit for controlling a memory access to the dynamic memory, having an input, which is connected to the external control terminal, for receiving an access command indicating the beginning of a memory access, and having an output, which is connected to the dynamic memory, for outputting at least one activation signal, read command or write command and precharge command generated from the access command.

The integrated memory chip according to the invention makes it possible to address the memory chip with the dynamic memory using a set of commands which is oriented to fast SRAM memories. The memory chip merely receives an access command, for example, from a connected processor, whereupon an activation signal, followed by a read command or write command and, finally, a precharge command are generated on-chip by the control circuit. This enables a situation where only an access command has to be transmitted between the memory chip and a connected microprocessor for a memory access. A DRAM controller separate from the memory chip does not have to be provided in a data processing system for addressing a DRAM memory.

The invention can be applied primarily to so-called RLDRAM memories, which have a high performance and storage capacity and are designed in particular for network applications. The invention therefore makes it possible to combine a very high storage capacity of a DRAM memory with optimized so-called random access times. This creates an alternative to fast SRAM to memories for operation in a data processing system, the SRAM memories having a much smaller memory size in comparison with DRAM memories.

In accordance with an added feature of the invention, the memory chip has an external address terminal, which is connected to an address terminal of the control circuit for receiving an address for the memory access, and the control circuit generates from a received address respective column addresses and row addresses for access to word lines and bit lines of the dynamic memory. This has the advantage that the DRAM-specific address generation with row addresses and column addresses is performed on-chip by the control circuit and so only one address has to be transmitted by the microprocessor.

In accordance with an additional feature of the invention, the memory chip has an external clock terminal for receiving an input clock for synchronized reading in of signals for the operation of the dynamic memory. In addition, the memory chip has an external terminal for a data reference signal, which is synchronized with output data to be output and which is derived from the input clock and is not synchronized with the latter. The memory chip thus has a terminal for a data reference signal which is like a so-called echo clock of an SRAM memory. However, the memory chip differs from a known DDR-DRAM memory, wherein a data reference signal is output in the form of a so-called data strobe signal. The generation of such a signal generally necessitates an additional so-called DLL circuit on the memory chip. Since the data reference signal of the memory chip according to the invention is derived from the input clock and is not synchronized with the latter, no DLL circuit is required in this case. In other words, the input clock and the data reference signal have a phase shift during operation of the memory chip.

The data reference signal serves, in particular, for controlling a memory access to the memory. In particular, the data reference signal indicates to an external functional unit the instant at which data to be read out are present at a data terminal. During a read access, the data reference signal is transmitted from the memory toward the outside together with data signals to be output and serves as reference signal of the data to be read out. In the memory according to the invention, the processing times of the data reference signal which is derived from the input clock (so-called clock tree) and the processing time of the output data to be output are synchronized with one another.

In accordance with a further feature of the invention, the memory chip has a plurality of external data terminals which are subdivided into at least two groups. Each of the groups is assigned to one of at least two terminals for a respective data reference signal, so that the assigned data reference signal is used as reference for data at the external data terminals of one of the groups. A so-called echo clock is thus provided for each group of data terminals, so that it can be ensured that a time shift between the echo clock signal and the output data of the DRAM memory is minimal. For individual groups of data terminals, the corresponding processing times are easier to synchronize with the data reference signal generated from the input clock.

In accordance with a concomitant feature of the invention, the dynamic memory has a memory cell array having bit lines and word lines, the memory chip has an external clock terminal for receiving an input clock, the control circuit is designed in such a way that, for a memory access, a plurality of individual actions to be performed from the activation of one of the word lines up to the precharging of the word lines are controlled in a synchronized manner with the input clock.

This makes it possible, in particular, to control the performance of a memory access with a clock signal which is made available for example by a synchronous circuit which communicates with the memory, in such a way that a high data throughput is made possible between the synchronous circuit and the dynamic memory. Since the individual actions—to be performed for a memory access—from the activation of one of the word lines up to the precharging of the word lines are controlled in a synchronized manner with the clock signal, so-called wait states can be avoided. In other words, the synchronous circuit does not have to wait for an unnecessarily long time for the processed data of the dynamic memory for further processing, since the memory access is synchronized with the clock signal.

Other features which are considered as characteristic for the invention are set forth in the appended claims.

Although the invention is illustrated and described herein as embodied in an integrated memory chip with a dynamic memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic block diagram of one embodiment of an integrated memory chip according to the invention; and FIG. 2 is a schematic block diagram of a further embodiment of a memory chip according to the invention.

DESCRIPTION OF THE PREFERRED EMBODIMENTS

Referring now to the figures of the drawing in detail and first, particularly, to FIG. 1 thereof, there is shown a memory chip 1 having a plurality of external terminals 11 to 14. The latter are connected to a microprocessor 4. A clock signal CK and an access command R/W are transmitted from the microprocessor 4 to the memory chip 1 via a control terminal 11. The terminal 14 serves for the transmission of address signals ADR, the terminal 13 serves for the transmission of a data reference signal DQS from the memory chip 1 to the microprocessor 4 and the terminal 12 serves for exchanging data signals DQ. The terminals 11 to 14 are connected to terminals 31 to 34 of a control circuit 3.

The memory chip 1 has a dynamic memory 2 with a plurality of memory banks B0 to B7. Each of the memory banks B0 to B7 contains a memory cell array in a matrix-type arrangement, which array has word lines WL and bit lines BL. Memory cells MC are arranged at crossover or intersection points between the word lines WL and the bit lines BL. The memory cells have a selection transistor and a storage capacitor in a conventional DRAM configuration.

The control circuit 3 serves for controlling a memory access to the dynamic memory 2. The terminals 35 to 40 thereby serve to transmit an activation signal ACT, a read command RD or a write command WR, a precharge command PR and to transmit column addresses CADR, row addresses RADR, and a data reference signal DQS.

For a memory access to the dynamic memory 2, the microprocessor 4 transmits only the access command R/W in addition to a clock signal CK. At the same time, the address ADR of the memory cell MC to be addressed is transmitted. From this information, a plurality of DRAM-typical individual actions from the activation of one of the word lines WL up to the precharging of the word lines WL are performed on-chip by way of the control circuit 3 for a memory access. The beginning of each individual action is advantageously controlled in a synchronized manner with the input clock CK. Since only an access command R/W is necessary for a memory access, a data and control bus is not burdened by DRAM-typical access commands.

A high capacity utilization of a data and control bus between the memory chip 1 and the microprocessor 4 is achieved in particular if a plurality of memory accesses to respectively different memory banks B0 to B7 are performed successively. After the memory access to the last of the memory banks has been triggered, a datum DQ to be read out from the memory bank addressed first can be read out next. An optimum utilization of a databus is therefore made possible in the case of a so-called multi-bank system of this type.

FIG. 2 illustrates a further embodiment of a memory chip 10 according to the invention with a control circuit 30 and a dynamic memory 20. In contrast to the memory chip 1 illustrated in FIG. 1, the memory chip 10 has a plurality of external data terminals, subdivided into groups, for the data signals DQ1 to DQ4. In this case, the terminals for the data signals DQ1 and DQ2 are combined to form a group G2, and the terminals for the data signals DQ3 and DQ4 are combined to form a group G1. The group of data terminals G1 is assigned to a terminal for a data reference signal DQS2, and the group G2 is assigned to the terminal for the data reference signal DQS1. Consequently, the data reference signal DQS1 is used as reference for the data DQ1 and DQ2, and the data reference signal DQS2 is correspondingly used as reference for the data DQ3 and DQ4.

The data reference signals DQS1 and DQS2 are synchronized with the respectively assigned data signals DQl to DQ4. The data reference signals are derived from the input clock CK without the interposition of a DLL circuit. The subdivided configuration according to the invention has the advantage that the signal propagation time of the so-called clock tree between the input clock CK and the respective data reference signal DQS1, DQS2 can be better synchronized with the respective processing times of the assigned data signals DQ1 to DQ4, for example by means of a correspondingly coordinated layout of the respective wiring and functional groups of the mutually assigned signals.

We claim:

1. An integrated memory chip, comprising:

an external control terminal;

a dynamic memory;

a control circuit for controlling a memory access to said dynamic memory; and an external address terminal;

said control circuit having an input connected to said external control terminal, for receiving an access command indicating a beginning of a memory access; and said control circuit having an output connected to said dynamic memory, for outputting at least one signal generated from the access command and selected from the group consisting of an activation signal, a read command or write command, and a precharge command;

said dynamic memory having word lines and bit lines;

said control circuit having an address terminal for receiving an address for the memory access;

said external address terminal connected to said address terminal of said control circuit; and said control circuit for generating, from a received address, respective column addresses and row addresses for access to said word lines and said bit lines of said dynamic memory.

2. The integrated memory chip according to claim 1, wherein:

an external clock terminal of the memory chip receives an input clock for synchronized reading in of signals for an operation of said dynamic memory; and an external terminal of the memory chip is configured to output a data reference signal that is synchronized with output data to be output, that is derived from the input clock, and that is not synchronized with the input clock.

3. The integrated memory chip according to claim 2, which comprises:

a plurality of external data terminals of the memory chip subdivided into at least two groups; and wherein each of said groups is assigned one of at least two terminals for a respective data reference signal, and the assigned data reference signal is used as reference for data at said external data terminals of one of said groups.

4. The integrated memory chip according to claim 1, wherein:

said dynamic memory has a memory cell array with bit lines and word lines;

an external clock terminal of the memory chip is configured to receive an input clock; and said control circuit is configured, for a memory access, to control a plurality of individual actions to be performed from an activation of one of said word lines up to a precharging of said word lines in synchronicity with the input clock.

* * * * *